(12) United States Patent
Horii et al.

(10) Patent No.: US 7,085,189 B2
(45) Date of Patent: Aug. 1, 2006

(54) NONVOLATILE SEMICONDUCTOR STORAGE DEVICE

(75) Inventors: Takashi Horii, Higashimurayama (JP); Ken Matsubara, Higashimurayama (JP); Keiichi Yoshida, Musashimurayama (JP)

(73) Assignee: Renesas Technology Corp., Tokyo (JP)

( * ) Notice: Subject to any disclaimer, the term of this patent is extended or adjusted under 35 U.S.C. 154(b) by 163 days.

(21) Appl. No.: 10/503,640

(22) PCT Filed: Feb. 28, 2002

(86) PCT No.: PCT/JP02/01848

§ 371 (c)(1),
(2), (4) Date: Aug. 5, 2004

(87) PCT Pub. No.: WO03/073430

PCT Pub. Date: Sep. 4, 2003

(65) Prior Publication Data

US 2005/0082579 A1  Apr. 21, 2005

(51) Int. Cl.
*G11C 8/00* (2006.01)
(52) U.S. Cl. .................. 365/230.03; 365/194
(58) Field of Classification Search ............... None
See application file for complete search history.

(56) References Cited

U.S. PATENT DOCUMENTS 5,559,986 A * 9/1996 Alpert et al. ............... 711/144

FOREIGN PATENT DOCUMENTS

| JP | 6-84385 | 3/1994 |
|---|---|---|
| JP | 10-177799 | 6/1998 |
| JP | 10-214496 | 8/1998 |
| JP | 2000-82294 | 3/2000 |
| JP | 2001-35167 | 2/2001 |

OTHER PUBLICATIONS

I. Yoshihisa et al., "The 32M-Bit NAND Type Flash Memory", *Denshizairyo*, No. 6, pp. 32-37, Jun. 1, 1995, pp. 32-37 (with English Translation).

* cited by examiner

Primary Examiner—Thong Q. Le
(74) Attorney, Agent, or Firm—Miles & Stockbridge PC (57) ABSTRACT

The disclosed flash memory is provided with a majority logic circuit 3 and shift registers $6_1$ to $6_3$. Three out of the banks 2a to 2c of the memory respectively include management information areas KAs to store binary management information comprising power supply trimming data and bitline restoration data. During initialization of the flash memory, the majority logic circuit 3 performs error correction on management information bits retrieved from the management information areas KAs and outputs that information to a trimming/restoration data buffer 11, thus providing highly reliable management information very quickly. The shift registers $6_1$ to $6_3$ delay a control signal that is output from a control circuit 12 by a certain period of time before outputting the control signal to sense amplifiers $4_2$ to $4_4$. This delay makes it possible to make the operating currents of the banks 2a to 2d start to flow at different times and to suppress a peak current flowing in the flash memory.

7 Claims, 7 Drawing Sheets

FIG. 8

NONVOLATILE SEMICONDUCTOR STORAGE DEVICE

TECHNICAL FIELD

The present invention relates to a nonvolatile semiconductor storage device and, more particularly, to an effective technique for reading management information at a higher speed from a multivalue flash memory.

BACKGROUND ART

A flash memory is one type of nonvolatile memory that is electrically programmable and erasable. As is known, the flash memory typically consists of an array of AND-type memory cells in which charging and discharging a floating gate, using a tunnel current, are performed for data writing and erasure.

As the present inventors examined such a flash memory, we have known that the flash memory is furnished with management information comprising power supply trimming data, bitline restoration data, and the like by programming fuses. When the flash memory is initialized upon its power-on or the like, the management information stored in the fuses of the flash memory are read, a fine adjustment of voltage that a power supply circuit generates is performed, and restoration of a defective memory cell or memory line is performed by replacing it with a spare row or column.

This type of semiconductor memory is described in detail in a journal "Denshizairyo" June issue, edited by Osima Msashi, Jun. 1, 1995, Vol. 34, No. 6, pp. 32–37, published by Kogyo Chosakai Publishing Co. Ltd, which is an example of prior art reference. In this reference, flash memory reading, writing, and easing operations and relations are described.

However, the present inventors found the following problems with the technique of programming the fuses of the flash memory to store the management information as mentioned above.

In programming the fuses to store the management information, a process of cutting the fuses must be performed, based on the result of inspection through a power supply trimming test and restoration test which are performed when a wafer is tested. This results in a problem of increasing the number of man-hours and a decrease in efficiency.

To cut the fuses, an apparatus for cutting the fuses by laser light such as laser repair is required. This results in a problem of an increase in flash memory production cost.

Once a fuse has been cut, it is impossible to connect it again. For example, in a flash memory development stage, the management information cannot be changed or modified flexibly, which results in a problem of a decrease in design development efficiency.

It is an object of the present invention to provide a nonvolatile semiconductor storage device whose initialization time is greatly reduced by reading management information at a higher speed and with accuracy and whose power consumption during operation can be reduced.

The above and other objects and novel features of the present invention will be apparent from the description of the present specification and the accompanying drawings.

DISCLOSURE OF THE INVENTION

1. One aspect of the present invention is a nonvolatile semiconductor storage device which comprises a plurality of memory banks, each comprising a memory array in which memory cells are arranged in an array, and the nonvolatile semiconductor storage device comprises: management information areas to store management information, provided respectively in three or more odd-numbered memory banks of the plurality of memory banks which are controlled simultaneously; and a majority logic circuit which makes a majority logic decision of corresponding management information bits which have been read from the management information areas and fixes the management information.

2. In the above item 1, the management information that is stored in the management information areas comprises power supply trimming data and bitline restoration data.

3. Another aspect of the present invention is a nonvolatile semiconductor storage device comprising delay circuits which delay a control signal output from a control circuit for simultaneous access to plurality of memory banks by a certain period of time, and output a time-delayed control signal to sense amplifiers respectively connected to the memory banks.

4. In the above item 3, by the control signal that is delayed by the delay circuits, precharging bitlines of the memory banks when reading starts, delayed by a certain period of time after the start of precharging the preceding memory bank bitline.

5. A further aspect of the present invention is a nonvolatile semiconductor storage device which comprises: management information areas to store management information, provided respectively in three or more odd-numbered memory banks of plurality of memory banks which are controlled simultaneously; a majority logic circuit which makes a majority logic decision of corresponding management information bits which have been read from the management information areas and fixes the management information; and delay circuits which delay by a certain period of time a control signal output from a control circuit for simultaneous access to said plurality of memory banks, and output a time-delayed control signal.

6. In the above item 5, the management information that is stored in the management information areas comprises power supply trimming data and bitline restoration data.

7. In the above item 5 or 6, by the control signal that is delayed by the delay circuits, precharging bitlines of the memory banks when reading starts, delayed by a certain period of time after the start of precharging the preceding memory bank bitline.

8. In any one of the above items 1 through 7, the memory cells arranged in the plurality of memory banks comprise multilevel memory cells which store data consisting of two bits or more with a plurality of certain levels of threshold voltages being set.

BEST MODE FOR CARRYING OUT THE INVENTION

To explain the present invention in detail, its preferred embodiment is now described, according to the accompanying drawings. In all drawings to explain the preferred embodiment, the same functional components are assigned the same reference numerals and repeated description thereof is omitted.

In the present embodiment, a flash memory (nonvolatile semiconductor storage device) 1 is the one in which information is stored into a memory cell by setting a plurality of certain levels of threshold voltages and may be either a two-level flash memory to store one bit information in one memory cell or a multilevel flash memory using a multilevel storage technology to store information consisting of two bits or more in one cell.

Figure 1:
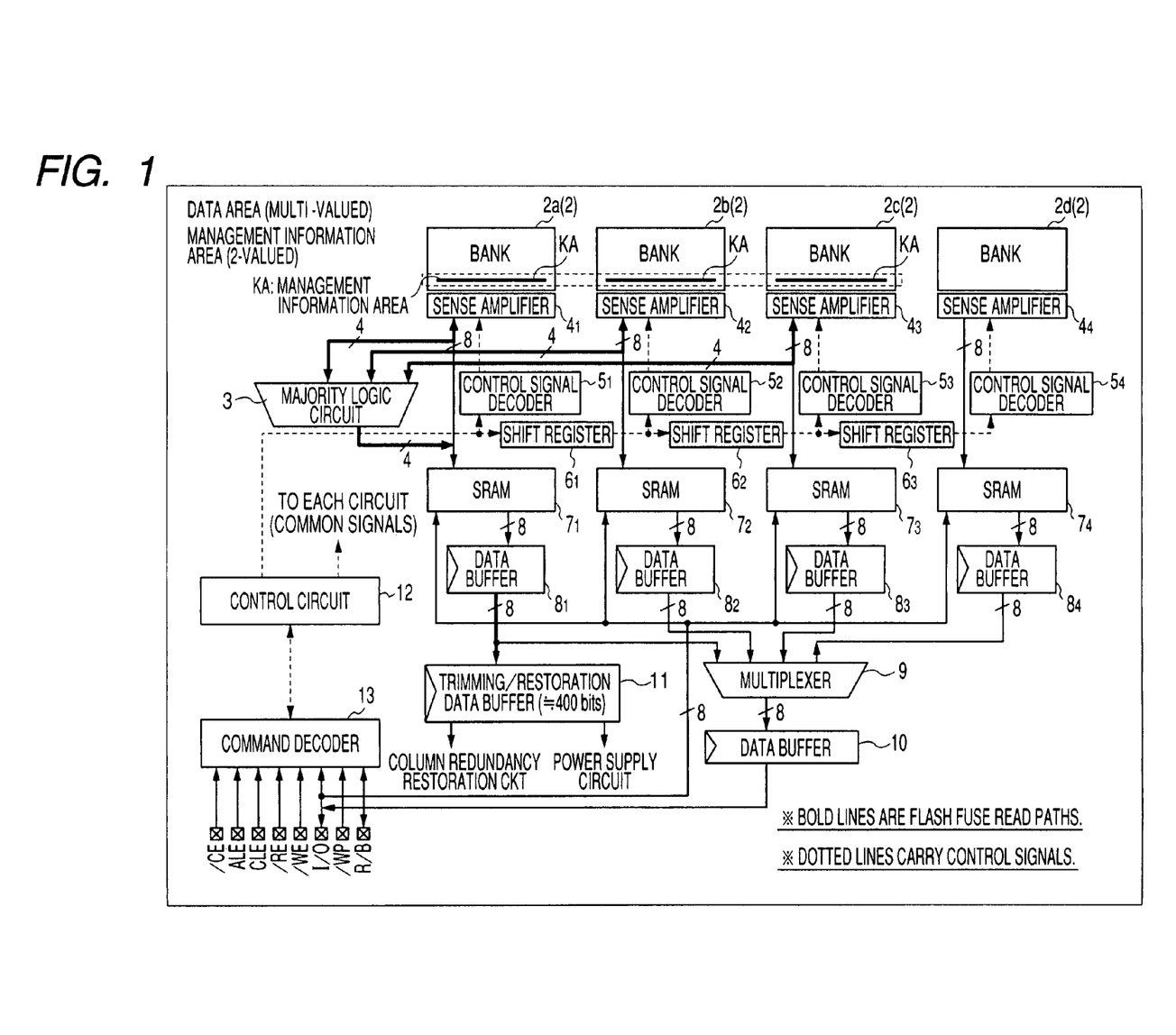
FIG. 1 is a block diagram showing a primary part of a flash memory according to a preferred embodiment of the present invention.

As shown in FIG. 1, this flash memory 1 primarily comprises a control block, a memory array 2, and a majority logic circuit 3. The control block is made up of sense amplifiers $4_1$–$4_4$, control signal decoders $5_1$–$5_4$, shift registers (delay circuits) $6_1$–$6_3$, SRAMs $7_1$–$7_4$, data buffers $8_1$–$8_4$, a multiplexer 9, data buffer 10, a trimming/restoration data buffer 11, a control circuit 12, a command decoder 13, and other components.

The memory array 2 has a multi-bank structure, divided into four banks 2a–2d, which operate by a simultaneous control method in which the four banks 2a–2d of the flash memory 1 are simultaneously controlled.

Management information areas KAs are provided in the banks 2a–2c, respectively. In these management information areas KAs, binary (two-valued) management information comprising power supply trimming data, bitline restoration data, and the like is stored.

The management information of same contents is stored in the management information areas KAs of the banks 2a–2c and same data is stored at the corresponding addresses of the banks 2a–2c.

The majority logic circuit 3 makes a majority logic decision of corresponding management data retrieved from the management information areas KAs of the banks 2a–2c and outputs the result of the decision.

The sense amplifiers $4_1$–$4_4$ amplify data output from memory cells in the banks 2a–2d, respectively, and output the amplified data. The control signal decoders $5_1$–$5_4$ decode various control signals output from the control circuit and output the decoded signals to the sense amplifiers $4_1$–$4_4$, respectively.

The shift registers $6_1$–$6_3$ delay the various control signals output from the control circuit 12 to the control signal decoder $5_2$–$5_4$ by a certain period of time. The SRAMs $7_1$–$7_4$, hold data from writable cells, which have been output from the sense amplifiers $4_1$–$4_4$, respectively.

The data buffers $8_1$–$8_4$, temporarily store data output from the SRAMs $7_1$–$7_4$ and then forward the data. The multiplexer 9 selects a piece of data from the individual pieces of data output from the data buffers $8_1$–$8_4$ and outputs the piece of data.

The data buffer 10 temporarily stores the data output from the multiplexer 9 and then forwards that data. Management information that has been fixed by the majority logic decision made by the majority logic circuit 3 is forwarded via the SRAM $7_1$ and data buffer $8_1$ and stored into the trimming/restoration data buffer 11. The management information stored in the trimming/restoration data buffer 11 is supplied to a bitline (column) redundancy restoration circuit and a power supply circuit.

The control circuit 12 outputs various control signals, based on decoded signals output from the command decoder 12, and exercises control over all operations in the flash memory 1. The command decoder 12 outputs various control signals which are input from the external and decoded command signals.

Then, how the flash memory 1 of the present embodiment operates is explained.

Figure 2:
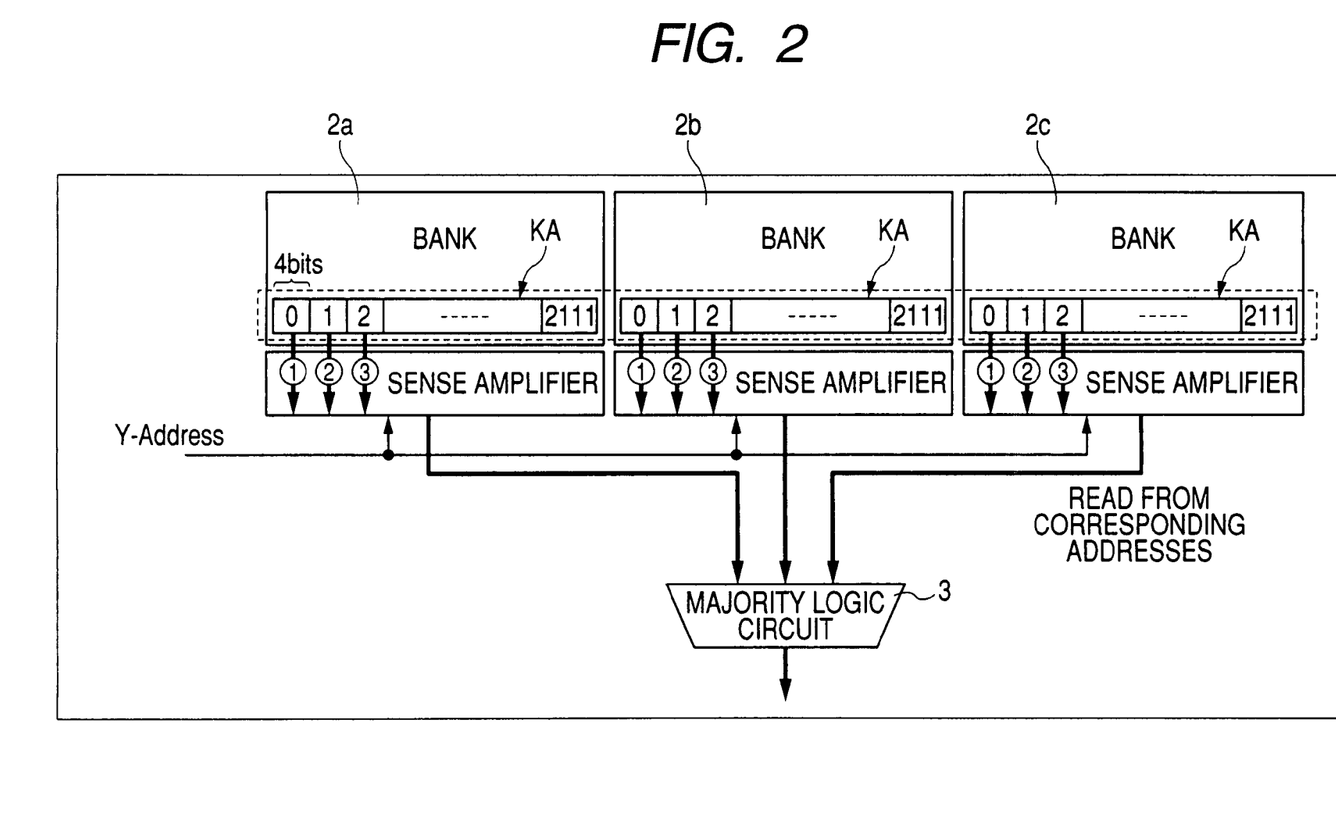
FIG. 2 is an explanatory diagram of management information reading operation in the flash memory of FIG. 1.

When the power of the flash memory 1 is turned on, first, the flash memory is initialized. During this initialization, the control circuit 12 outputs an address, and, based on that address, management information is sequentially read from the management information areas KAs of the banks 2a–2c, as is illustrated in FIG. 2. For example, four bits of management information per cycle are read from the management information areas KAs of the banks 2a–2c.

The four bits of management information respectively read from the management information areas KAs of the banks 2a–2c undergo a majority logic decision by the majority logic circuit and thereby management information bits are fixed. The resultant management information bits are forwarded via the SRAM $7_1$ and data buffer $8_1$ and stored into the trimming/restoration data buffer 11.

Then, based on bitline restoration data which corresponds to the management information bits stored in the trimming/restoration data buffer 11, the column redundancy restoration circuit restores a defective memory cell or bitline. Based on power supply trimming data which corresponds to the management information bits stored in the trimming/restoration data buffer 11, the power supply circuit trims the levels of various power supply voltages.

Through the above-described manner of operation, the reliability of management information that is read in an unstable state during the initialization can be ensured and management information can be read very quickly.

In the flash memory 1 during normal operation after the completion of initialization, a control signal that is output from the control circuit 12 is delayed by a certain period of time through the shift registers $6_1$–$6_3$ before being output. In this embodiment, the delay time through the shift registers $6_1$–$6_3$ is synchronized with one cycle of clock signal.

Now, operation of the flash memory 1 for writing, reading, or erasure is explained.

Figure 3:
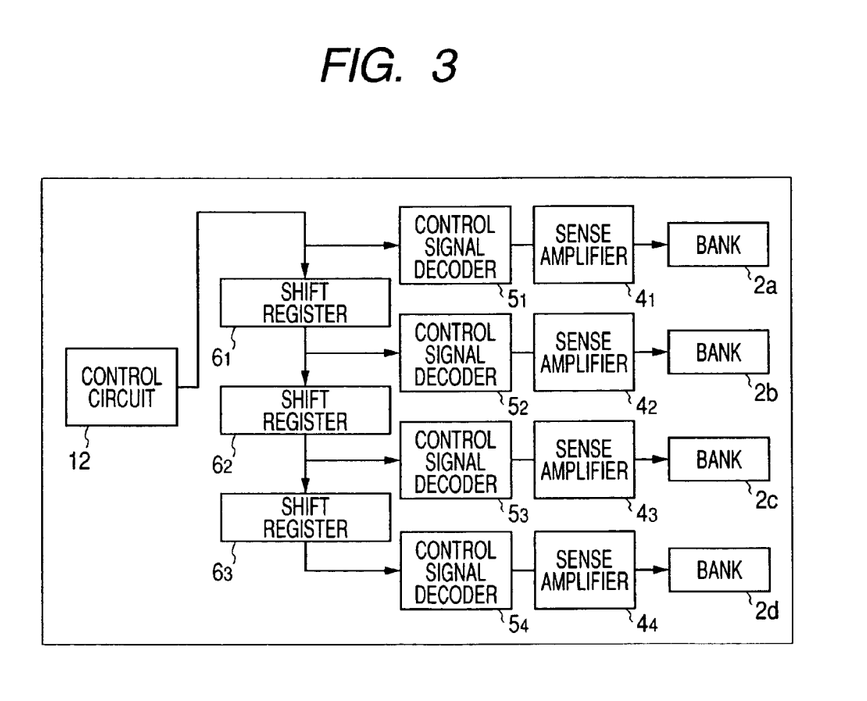
FIG. 3 is an explanatory diagram showing the flow of a control signal output from a control circuit included in the flash memory of FIG. 1.
Figure 4:
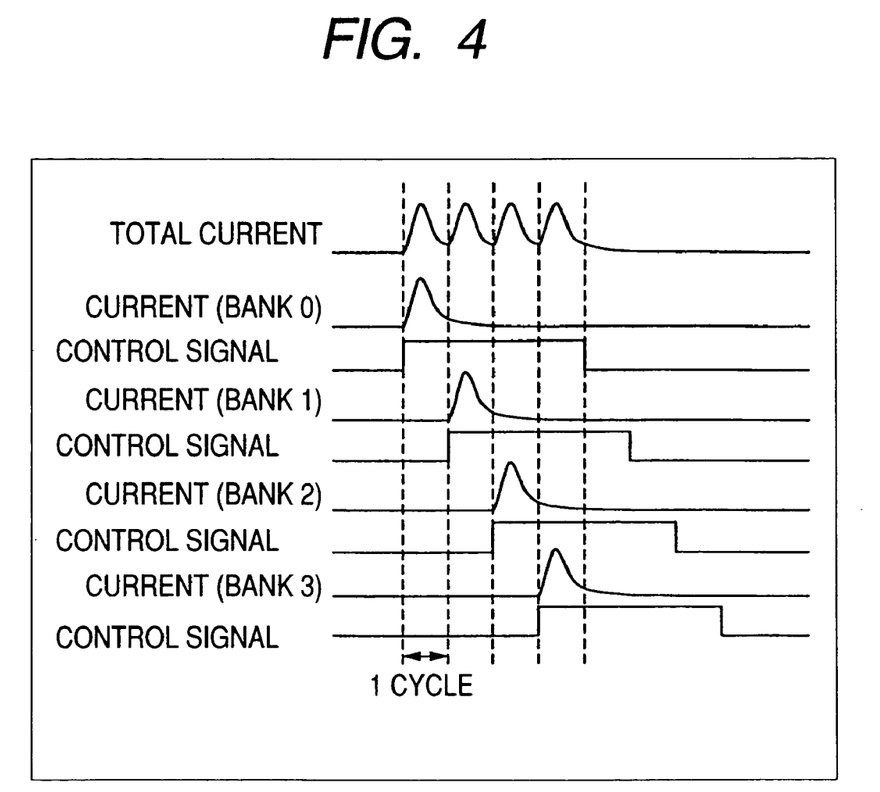
FIG. 4 is a timing chart showing control signal waveforms and consumption current waveforms per bank during operation of the flash memory of FIG. 1.

FIG. 3 is an explanatory diagram showing the flow of a control signal output from the control circuit 12. FIG. 4 is a timing chart showing control signal waveforms and consumption current waveforms per bank.

The signal timing waveforms shown in FIG. 4, from the top to the bottom, correspond to consumption current of the flash memory 1, operating current of the bank 2a, control signal which is input to the sense amplifier $4_1$, operating current of the bank 2b, control signal which is input to the sense amplifier $4_2$, operating current of the bank 2c, control signal which is input to the sense amplifier $4_3$, operating current of the bank 2d, and control signal that is input to the sense amplifier $4_1$.

A control signal output from the control circuit 12 is first input to both the control signal decoder $5_1$ and shift register $6_1$. The input signal input to the control signal decoder $5_1$ is decoded and output to the sense amplifier $4_1$.

When receiving this decoded control signal, the sense amplifier $4_1$ operates and causes the operating current of the bank $2a$ to flow. The control current input to the shift register $6_1$ is delayed by one cycle of clock signal and output to both the control signal decoder $5_2$ and the shift register $6_2$.

The control signal input to the control signal decoder $5_2$ is decoded and output to the sense amplifier $4_2$. Therefore, the operating current of the bank $2b$ starts to flow one cycle later. The control signal input to the shift register $6_2$ is further delayed by one cycle of clock signal and output to both the control signal decoder $5_3$ and the shift register $6_3$.

The control signal input to the control signal decoder $5_3$ is decoded and output to the sense amplifier $4_3$ and the operating current of the bank $2c$ starts to flow one cycle later than that of the bank $2b$.

The control signal input to the shift register $6_3$ is further delayed by one cycle and output to the control signal decoder $5_4$. The control signal is decoded by the control signal decoder $5_4$ and output to the sense amplifier $4_4$ and the operating current of the bank $2d$ starts to flow one cycle later than that of the bank $2c$.

In this way, the control signal is delayed by the shift registers $6_1$–$6_3$ and input to the decoder $5_1$–$5_4$, and, consequently, the banks $2a$–$2d$ start to operate out of time, shifted by one cycle. Thus, the total current flowing in the flash memory 1 has regularly distributed peaks and the consumption current can be reduced to a great extent.

Figure 5:
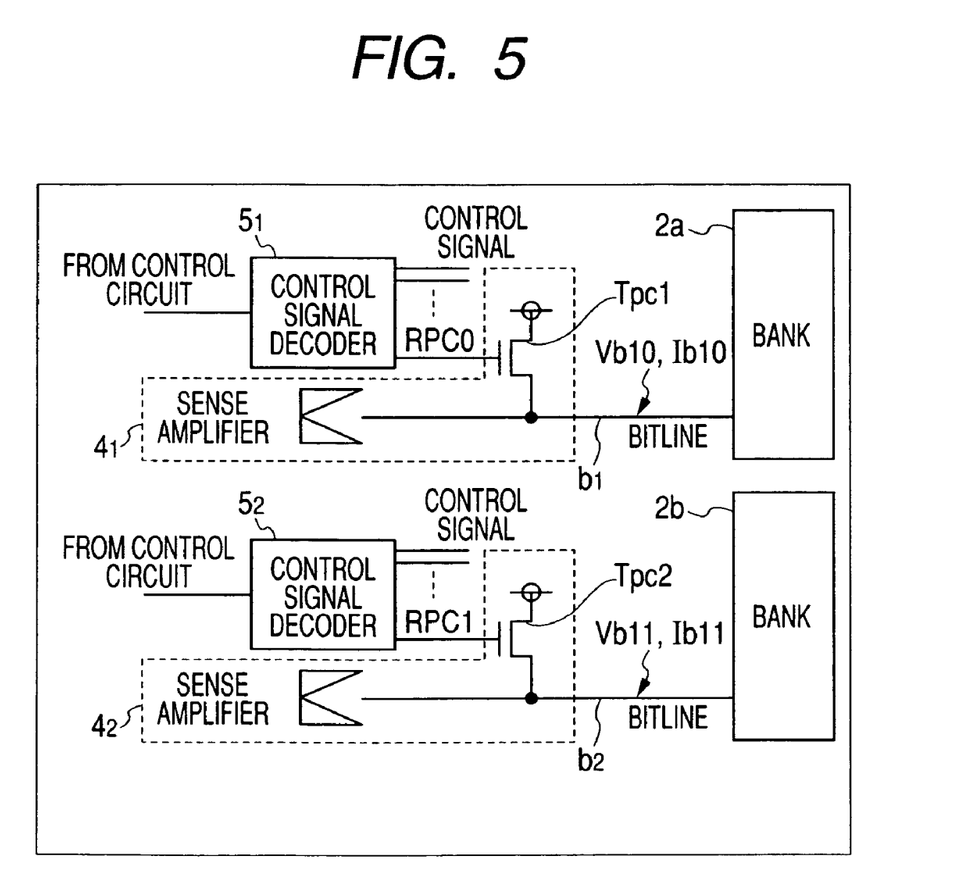
FIG. 5 is an explanatory diagram of bitline precharge in the flash memory of FIG. 1.

FIG. 5 is an explanatory diagram of bitline precharge in the flash memory 1. FIG. 5 depicts two bitline blocks where the banks $2a$, $2b$, sense amplifiers $4_1$, $4_2$, and control signal decoders $5_1$, $5_2$ are connected, respectively. Likewise, the banks $2c$, $2d$, sense amplifiers $4_3$, $4_4$, and control signal decoders $5_3$, $5_4$ are connected, though not shown.

Signal lines from the control signal decoders $5_1$, $5_2$ are connected to the sense amplifiers $4_1$, $4_2$, so that control signals RPC0, RPC1, output from the control signal decoders $5_1$, $5_2$, are respectively input to the gates of transistors Tpc1, Tpc2 for precharging the bit lines, provided in the sense amplifiers $4_1$, $4_2$.

Precharge supply voltage is applied to one end terminals of the transistors Tpc1, Tpc2. The bitlines b1 and b2 are connected to the other end terminals of the transistors Tpc1, Tpc2, respectively.

Figure 6:
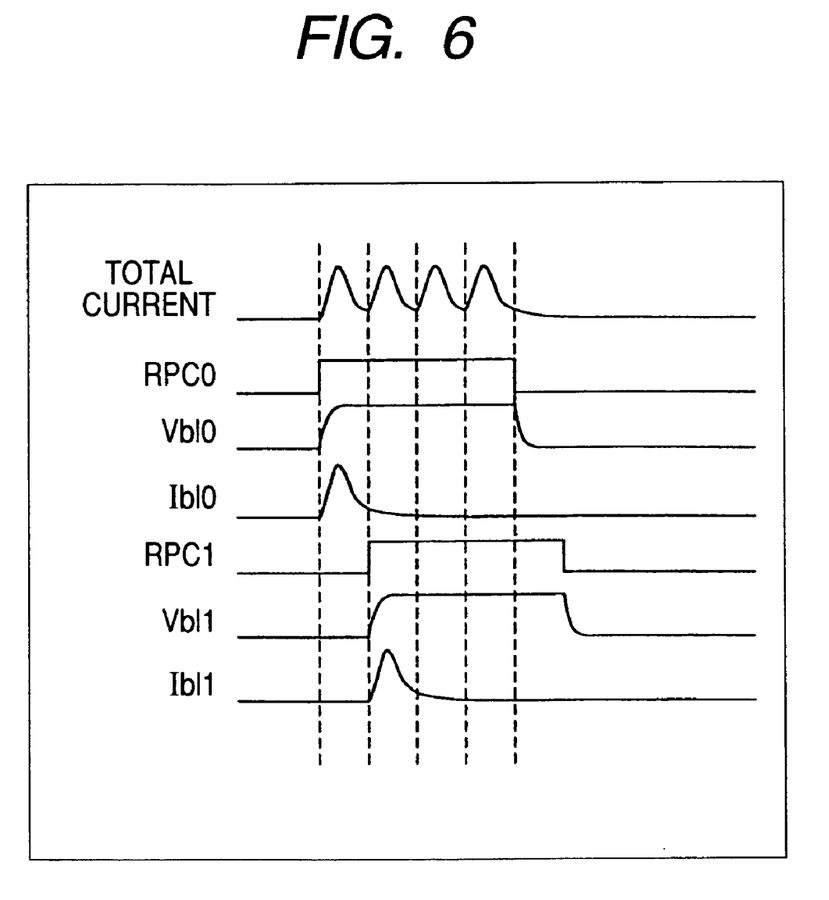
FIG. 6 is a timing chart of signals during bitline precharge.

FIG. 6 is a timing chart of signals during bitline precharge. Signal waveforms shown in FIG. 6, from the top to the bottom, correspond to total current of the flash memory 1, control signal RPC0 which is output from the control signal decoder $5_1$, voltage Vb10 which is applied to the bitline b1, current Ib10 flowing through the bitline b1, control signal RPC1 which is output from the control signal decoder $5_2$, voltage Vb11 which is applied to the bitline b2, and current Ib11 flowing through the bitline b2.

For bitline precharge, the control signal RPC1 which is output from the output from the control signal decoder $5_2$ is delayed through the shift register $6_2$ by one cycle later than the control signal RPC0 which is output from the control signal decoder $5_1$.

Accordingly, precharging the bitline b2 is started one cycle later than the start of precharging the bitline b1 and, thus, the current Ib11 starts to flow through the bitline b2 one cycle later than the start of the current Ib10 flowing through the bitline b1.

Because the current Ib10 flows and the current Ib11 flows, delayed by one cycle, the total current of the flash memory 1 flows with regularly distributed peaks. For the banks $2c$, $2d$ as well, precharge is delayed in the same way, and, consequently, the peak current value of the total current flowing in the flash memory 1 during precharge can be reduced by the order of a factor of 4.

The present inventors examined a flash memory in which a control signal is not delayed and the consumption current of that flash memory is discussed below.

Figure 7:
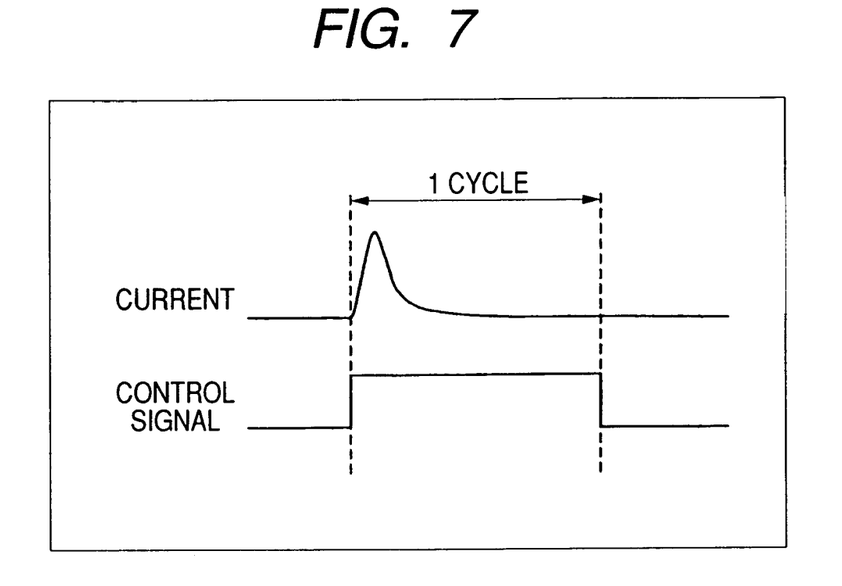
FIG. 7 is a timing chart of the waveform of current flowing in a flash memory that the present inventors examined.
Figure 8:
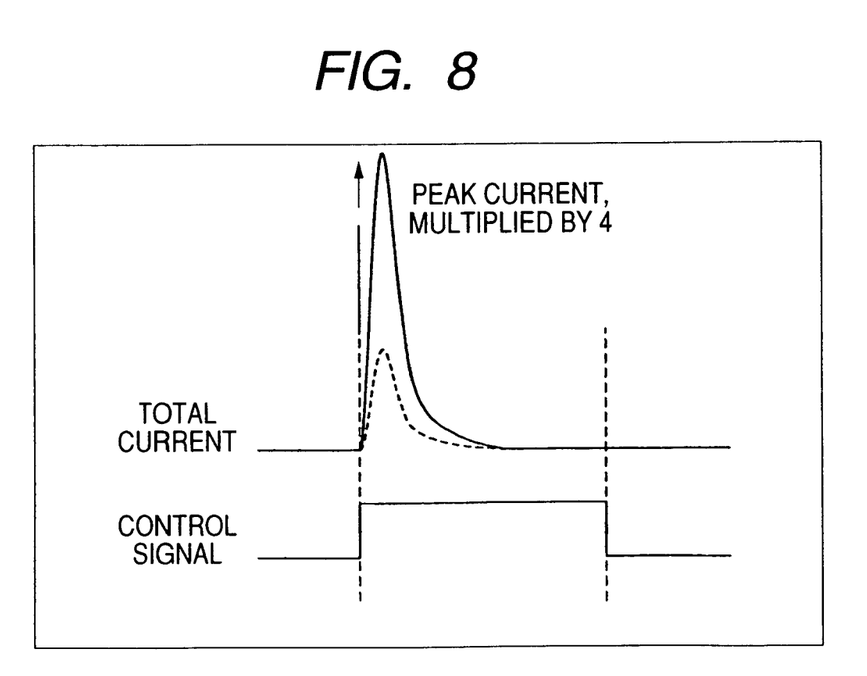
FIG. 8 is an explanatory diagram showing a peak current flowing in the flash memory in FIG. 7.

FIG. 7 shows the waveform of current flowing in the flash memory when a control signal is input. In the case where the control signal is not delayed, for example, in the flash memory with four banks, the four banks start to operate at a time and, at this time, a peak current multiplied by four flows in the flash memory, as shown in FIG. 8, which multiplies the total current as well as consumption current.

On the other hand, for the flash memory 1 in which the shift registers are provided, the shift registers enable that the banks $2a$–$2d$ start to operate at different timings shifted by one cycle for reading, writing, or erasure, and, thus, a peak of consumption current can be suppressed.

Therefore, according to the present invention, highly reliable management information can be read at a higher speed during the initialization state after the power is turned on and the time taken to initialize the flash memory 1 can be shortened.

By means of the shift registers $6_1$–$6_4$, the consumption currents of the banks $2a$–$2d$ during reading, writing, or erasure can be curtailed and, accordingly, the power consumption of the flash memory 1 can be reduced.

In the present embodiment, the flash memory 1 may be a multilevel flash memory or a two-level flash memory, which is not definite. Particularly, if the flash memory 1 is embodied as a multilevel flash memory, management information to be stored must have two-value states. For example, if two bits of information can be stored in one memory cell, four threshold voltage levels are found in threshold voltage distribution, and it is preferable to use the lowest threshold voltage level and the highest threshold voltage level among the four levels. Doing so can enhance the reliability of management information reading.

As for a method for storing information into multilevel flash memory cells, either of the following may be applied: a method in which information is stored by a threshold voltage that changes, according to the quantity of injected charges which can move freely in a charge storage region; and a method in which information is stored, depending on whether injected charges are locally stored in a charge storage region, wherein the injected charges are almost static in the charge storage region.

While the invention made by the present inventors has been described specifically, based on its preferred embodiment, it will be appreciated that the present invention is not limited to the embodiment described hereinbefore and various modifications and changes may be made thereto without departing from the spirit and scope of the invention.

INDUSTRIAL APPLICABILITY

As described above, the nonvolatile semiconductor storage device of the present invention is suitable for a technique for cutting the initialization time and reducing power consumption of a multilevel flash memory.

What is claimed is:

1. A nonvolatile semiconductor storage device which comprises a plurality of memory banks, each including a memory array in which memory cells are arranged in an array, and which is able to control parallel access to said plurality of memory banks, wherein management information areas to store management information are provided respectively in three or more odd-numbered memory banks of said plurality of memory banks, identical management information to be read at initialization is stored in said management information areas, said nonvolatile semiconductor storage device includes a majority logic circuit which makes a majority logic decision of corresponding management information bits which have been read from said management information areas and fixes said management information, and parallel reads of said management information bits from said odd-numbered memory banks are preformed.

2. The nonvolatile semiconductor storage device according to claim 1, wherein the management information that is stored in said management information areas comprises power supply trimming data and bitline restoration data.

3. The nonvolatile semiconductor storage device according to claim 1, further comprising delay circuits which delay by a certain period of time a control signal output from a control circuit for simultaneous access to said plurality of memory banks, and output a time-delayed control signal to sense amplifiers respectively connected to said memory banks.

4. The nonvolatile semiconductor storage device according to claim 3, wherein, by the control signal that is delayed by said delay circuits, precharging bitlines of said memory banks when reading starts, delayed by a certain period of time after the start of precharging the preceding memory bank bitline.

5. The nonvolatile semiconductor storage device according to claim 3, wherein the management information that is stored in said management information areas comprises power supply trimming data and bitline restoration data.

6. The nonvolatile semiconductor storage device according to claim 5, wherein, by the control signal that is delayed by said delay circuits, precharging bitlines of said memory banks when reading starts, delayed by a certain period of time after the start of precharging the preceding memory bank bitline.

7. The nonvolatile semiconductor storage device according to claim 1, wherein the memory cells arranged in said plurality of memory banks are multilevel memory cells which store data comprising two bits or more with a plurality of certain levels of threshold voltages being set.

* * * * *